(12) United States Patent
Marsh

(10) Patent No.: US 6,323,081 B1
(45) Date of Patent: *Nov. 27, 2001

(54) DIFFUSION BARRIER LAYERS AND METHODS OF FORMING SAME

(75) Inventor: Eugene P. Marsh, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,866

(22) Filed: Sep. 3, 1998

(51) Int. Cl.[7] ............................................. H01L 21/8242
(52) U.S. Cl. ..................... 438/239; 438/253; 438/396; 438/627; 438/650; 438/686
(58) Field of Search ..................... 438/239, 240, 438/241, 253, 256, 396, 399, 627, 650, 653, 686

(56) References Cited

U.S. PATENT DOCUMENTS

| | | |
|---|---|---|
| 3,839,164 | 10/1974 | Hurst . |
| 4,830,982 | 5/1989 | Dentai et al. . |
| 4,992,305 | 2/1991 | Erbil . |
| 5,045,899 | 9/1991 | Arimoto . |
| 5,096,737 | 3/1992 | Baum et al. . |
| 5,130,172 | 7/1992 | Hicks et al. . |
| 5,149,596 | 9/1992 | Smith et al. . |
| 5,187,638 | 2/1993 | Sandhu et al. . |
| 5,198,386 | 3/1993 | Gonzalez . |
| 5,232,873 | 8/1993 | Geva et al. . |
| 5,252,518 | 10/1993 | Sandhu et al. . |
| 5,270,241 | 12/1993 | Dennison et al. . |
| 5,341,016 | 8/1994 | Prall et al. . |
| 5,354,712 | 10/1994 | Ho et al. . |
| 5,362,632 | 11/1994 | Mathews . |
| 5,372,849 | 12/1994 | McCormick et al. . |
| 5,392,189 | 2/1995 | Fazan et al. . |
| 5,403,620 | 4/1995 | Kaesz et al. . |
| 5,464,786 | 11/1995 | Figura et al. . |
| 5,466,629 | 11/1995 | Mihara et al. . |
| 5,478,772 | 12/1995 | Fazan . |
| 5,480,684 | 1/1996 | Sandhu . |
| 5,487,923 | 1/1996 | Min et al. . |
| 5,498,562 | 3/1996 | Dennison et al. . |
| 5,506,166 | 4/1996 | Sandhu et al. . |
| 5,510,651 | 4/1996 | Maniar et al. . |
| 5,520,992 | 5/1996 | Douglas et al. . |

(List continued on next page.)

FOREIGN PATENT DOCUMENTS

| | | |
|---|---|---|
| 197 37 323 A | 3/1999 | (DE) . |
| 0 301 725 A2 | 2/1989 | (EP) . |
| 0 770 862 | 5/1997 | (EP) . |
| 9 162372 | 6/1997 | (JP) . |

OTHER PUBLICATIONS

Bhatt et al., "Novel high temperature multilayer electrode-barrier structure for high density ferroelectric memories," *Appl. Phys. Letter*, 71 (1997).

(List continued on next page.)

*Primary Examiner*—Sara Crane
(74) *Attorney, Agent, or Firm*—Mueting, Raasch & Gebhardt, P.A.

(57) ABSTRACT

A method for use in the fabrication of integrated circuits includes providing a substrate assembly having a surface and forming a barrier layer over at least a portion of the surface. The barrier layer is formed of a platinum(x):ruthenium(1−x) alloy, where x is in the range of about 0.60 to about 0.995; preferably, x is in the range of about 0.90 to about 0.98. The barrier layer may be formed by chemical vapor deposition and the portion of the surface upon which the barrier layer is formed may be a silicon containing surface. The method is used in formation of capacitors, storage cells, contact liners, etc.

34 Claims, 4 Drawing Sheets

U.S. PATENT DOCUMENTS

| | | |
|---|---|---|
| 5,555,486 | 9/1996 | Kingon et al. |
| 5,561,307 | 10/1996 | Mihara et al. |
| 5,566,045 | 10/1996 | Summerfelt et al. |
| 5,581,436 | 12/1996 | Summerfelt et al. |
| 5,599,424 | 2/1997 | Matsumoto et al. |
| 5,605,857 | 2/1997 | Jost et al. |
| 5,618,746 | 4/1997 | Hwang. |
| 5,637,527 | 6/1997 | Baek. |
| 5,639,698 | 6/1997 | Yamazaki et al. |
| 5,652,171 | 7/1997 | Nagano et al. |
| 5,654,222 | 8/1997 | Sandhu et al. |
| 5,654,224 | 8/1997 | Figura et al. |
| 5,661,115 | 8/1997 | Sandhu. |
| 5,663,088 | 9/1997 | Sandhu et al. |
| 5,679,225 | 10/1997 | Pastacataldi et al. |
| 5,679,980 | 10/1997 | Summerfelt. |
| 5,691,009 | 11/1997 | Sandhu. |
| 5,691,219 * | 11/1997 | Kawakubo et al. ........ 438/52 |
| 5,695,815 | 12/1997 | Vaartstra. |
| 5,696,384 | 12/1997 | Ogi et al. |
| 5,714,402 | 2/1998 | Choi. |
| 5,717,250 | 2/1998 | Schuele et al. |
| 5,728,626 | 3/1998 | Allman et al. |
| 5,744,832 | 4/1998 | Wolters et al. |
| 5,760,474 | 6/1998 | Schuele. |
| 5,962,716 | 10/1999 | Uhlenbrock et al. |
| 5,970,378 | 10/1999 | Shue et al. |
| 5,972,105 | 10/1999 | Yamazaki et al. |
| 5,990,559 | 11/1999 | Marsh. |
| 6,063,705 | 5/2000 | Vaartstra. |
| 6,074,945 | 6/2000 | Vaartstra et al. |
| 6,127,257 | 10/2000 | Pintchovski et al. |
| 6,133,159 | 10/2000 | Vaartstra et al. |
| 6,140,173 * | 10/2000 | Wolters et al. ........ 438/240 |
| 6,204,172 | 3/2001 | Marsh. |

OTHER PUBLICATIONS

Green et al., "Chemical Vapor Deposition of Ruthenium and Ruthenium Dioxide Films," *J. Electrochem. Soc.*, 132, 2677–2685 (1985).

Kawahara et al., "(Ba, Sr)TiO$_3$ Films Prepared by Liquid Source Chemical Vapor Deposition on Ru Electrodes," *Jpn. J. Appl. Phys.*, 35, 4880–4885 (1996).

Liao et al., "Characterization of RuO$_2$ thin films deposited on Si by metal–organic chemical vapor deposition," *Thin Solid Films*, 287, 74–79 (1996).

Al–Shareef et al., "Analysis of the oxidation kinetics and barrier layer properties of ZrN and Pt/Ru thin films for DRAM applications", *Thin Solid Films*, 280, 265–270 (1996).

Cohan et al., "Laser–assisted organometallic chemical vapor deposition of films of rhodium and iridium," *Appl. Phys. Lett.*, 60, 1402–1403 (1992).

Doppelt et al., "Mineral precursor for chemical vapor deposition of Rh metallic films," *Mater. Sci. Eng.*, 817, 143–146 (1993).

Etspuler et al., "Deposition of Thin Rhodium Films by Plasma–Enhanced Chemical Vapor Deposition," *Appl. Phys. A*, 48: 373–375 (1989).

Hoke et al., "Low–temperature Vapour Deposition of High-purity Iridium Coatings from Cyclooctadiene Complexes of Iridium," *J. Mater. Chem.*, 1, 551–554 (1991).

Hsu et al., "Synthesis and X–ray structure of the heteronuclear cluster, $(\mu-H)_2(\eta^5-C_5H_5)IrOS_3(CO)_{10}$," *Journal of Organometallic Chemistry*, 426, 121–130 (1992).

Johnson et al., "Chemistry," *Nature*, 901–902 (1967).

Kaesz et al., "Low–Temperature Organometallic Chemical Vapor Deposition of Transition Metals," *Mat. Res. Soc. Symp. Proc.*, 131, 395–400 (1989).

Khakani et al., "Pulsed laser deposition of highly conductive iridium oxide thin films," *Appl. Phys. Lett.*, 69, 2027–2029 (1991).

Kumar et al., "New precursors for organometallic chemcal vapor deposition of rhodium," *Can. J. Chem.*, 69, 108–110 (1991).

Kwon et al., "Characterization of Pt Thin Films Deposited by Metallorganic Vapor Deposition for Ferroelectric Bottom Electrodes," *J. Electrochem. Soc.*, 144, 2848–2854 (1997).

Lu et al., "Ultrahigh vacuum chemical vapor deposition of rhodium thin films on clean and TiO$_2$–covered Si(111)," *Thin Solid Films*, 208, 172–176 (1992).

Macchioni et al., "Cationic Bis–and Tris(η2–(pyrazol–1–yl)methane) Acetyl Complexes of Iron (II) and Ruthenium (II): Synthesis, Characterization, Reactivity, and Interionic Solution Structure by NOESY NMR Spectroscopy," *Organometallics*, 16, 2139–2145 (1997).

Macomber et al., "The Synthesis and $^1$H NMR Study of Vinyl Organometallic Monomers: $(\eta^5-C_5H_4CH=CH_2)M(CO)_2(NO)$ (M=Cr, Mo, W) and $(\eta^5-C_5H_4CH_2)M(CO)_2$ (M=Co, Rh, Ir)," *Journal of Organometallics Chemistry*, 250, 311–318 (1983).

Niemer, B., et al., "Organometallic chemical vapor deposition of tungsten metal, and suppression of carbon incorporation by codeposition of platinum," *Appl. Phys. Lett.*, 61(15):1793–1795 (1992).

Pathangey et al., "Various approaches have been explored to obtain atomic layer controlled growth, but one of the most straightforward growth techniques is molecular beam epitaxy (MBE)," *Vacuum Technology and Coating*, 33–41 (May 2000).

Rausch et al., "Isolation and Structural Characterization of Bis(η$^5$–cyclopentadienyl)bis(carbonyl)–$\mu$–(o–phenylene) –diiridium (Ir–Ir), $(C_5H_5)_2Ir_2(C_6H_4)$: A Product Formally Derived from the Double Oxidative Addition of Benzene to Iridium," *J. Amer. Chem. Soc.*, 99, 7870–7876 (1977).

Smith et al., "Low–Temperature Chemical Vapor Deposition of Rhodium and Iridium Thin Films," *Mat. Res. Soc. Symp. Proc.*, 168, 369–374 (1990).

Suntola, "Atomic layer epitaxy," *Thin Solid Films*, 216, 84–89 (1992).

Takasu, T., et al., "Preparation of a novel Pt–RuO$_2$/Ti electrocatalyst by use of highly porous ruthenium oxide support prepared from RuO$_2$–La$_2$O$_3$/electrode," *Journals of Alloys and Compounds*, 261, 172–175 (1997).

Uchida et al., "Preparation of organoiridium compound for metalorganic chemical vapor deposition (MOCVD) of thin film of iridium or iridium oxide," (Abstract of JP 08,306, 627) CA Selects: Chemical Vapor Deposition, 5, 1, Abstract No. 126:89572d (1997).

Van Hemert et al., "Vapor Deposition of Metals by Hydrogen Reduction of Metal Chelates," *J. Electrochem. Soc.*, 112, 1123–1126 (1965).

Versteeg et al., "Metalorganic Chemical Vapor Deposition by Pulsed Liquid Injection Using An Ultrasonic Nozzle: Titanium Dioxide on Sapphire from Titanium (IV) Isopropoxide," *J. Am. Ceram. Soc.*, 78, 2763–2768 (1995).

* cited by examiner

DIFFUSION BARRIER LAYERS AND METHODS OF FORMING SAME

FIELD OF THE INVENTION

The present invention relates to semiconductor devices and the fabrication thereof. More particularly, the present invention pertains to diffusion barrier layers.

BACKGROUND OF THE INVENTION

In the fabrication of integrated circuits, various conductive layers are used. For example, during the formation of semiconductor devices, such as dynamic random access memories (DRAMs), static random access memories (SRAMs), ferroelectric (FE) memories, etc., conductive materials are used in the formation of storage cell capacitors and also may be used in interconnection structures, e.g., conductive layers in contact holes, vias, etc. In many applications, it is preferable that the material used provide effective diffusion barrier characteristics.

For example, effective diffusion barrier characteristics are required for conductive materials used in the formation of storage cell capacitors of memory devices, e.g., DRAMs. As memory devices become more dense, it is necessary to decrease the size of circuit components forming such devices. One way to retain storage capacity of storage cell capacitors of the memory devices and at the same time decrease the memory device size is to increase the dielectric constant of the dielectric layer of the storage cell capacitor. Therefore, high dielectric constant materials are used in such applications interposed between two electrodes. One or more layers of various conductive materials may be used as the electrode material. However, generally, one or more of the layers of the conductive materials used for the electrodes (particularly the lower electrode of a cell capacitor) must have certain barrier properties and oxidation resistance properties. Such properties are particularly required when high dielectric constant materials are used for the dielectric layer of the storage cell capacitor because of the processes used for forming such high dielectric materials, e.g., deposition of high dielectric materials usually occurs at high temperatures (generally greater than about 500° C.) in an oxygen-containing atmosphere.

Generally, various metals and metallic compounds, and typically notable metals such as platinum and conductive oxides such as ruthenium oxide, have been proposed as the electrodes or at least one of the layers of the electrodes for use with high dielectric constant materials. However, reliable electrical connections should generally be constructed which do not diminish the beneficial properties of the high dielectric constant materials. For platinum to function well as a bottom electrode, it must be an effective barrier to the diffusion of oxygen. This is required since any oxidation of underlying silicon upon which the capacitor is formed will result in a decreased series capacitance, thus degrading the storage capacity of the cell capacitor. Platinum, used alone as an electrode layer, is too permeable to oxygen to be used as a bottom electrode of a storage cell capacitor.

Because of the permeability of platinum to oxygen, typically platinum is used as a layer in an electrode stack which acts as the electrode as well as a diffusion barrier for integration of capacitors directly formed on silicon. For example, as described in the article "Novel High Temperature Multilayer Electrode-Barrier Structure for High Density Ferroelectric Memories" by H. D. Bhatt, et al., *AppL Phys.Letter*, 71(5), Aug. 4, 1997, the electrode barrier structure includes layers of platinum:rhodium alloy, in addition to platinum:rhodium oxide layers, to form electrodes with diffusion barrier properties. Such alloy layers are formed using physical vapor deposition (PVD) processing, e.g., reactive RF sputtering processes.

Many storage cell capacitors are formed using high aspect ratio openings.

For example, in U.S. Pat. No. 5,392,189 to Fazan, et al., entitled "Capacitor Compatible with High Dielectric Constant Materials Having Two Independent Insulative Layers and the Method for Forming Same," issued Feb. 21, 1995, the storage cell capacitors include a lower electrode that is formed by deposition of a conductive material within a small high aspect ratio opening. Typically, sputtering does not provide a sufficiently conformal layer adequate for formation of an electrode within such a small high aspect ratio opening.

In addition to the formation of capacitor electrodes, the formation of barrier layers for use in other applications, e.g., interconnect applications, is also desirable. For example, diffusion barriers are commonly used to prevent undesirable reactions in contact openings.

SUMMARY OF THE INVENTION

To overcome the problems described above with respect to the use of platinum alone as an electrode material, and others which will be apparent from the detailed description below, a platinum:ruthenium diffusion barrier layer, structures incorporating such layers, and methods associated therewith are described herein.

A method for use in the fabrication of integrated circuits according to the present invention includes providing a substrate assembly having a surface and forming a barrier layer over at least a portion of the surface. The barrier layer is formed of a platinum(x):ruthenium(1−x) alloy, where x is in the range of about 0.60 to about 0.995.

In other embodiments of the method, preferably, x is in the range of about 0.90 to about 0.98, and more preferably, x is about 0.95. In another embodiment of the method, the barrier layer is formed by chemical vapor deposition. In yet another embodiment of the method, the portion of the surface upon which the barrier layer is formed is a silicon containing surface.

Another method for use in the formation of a capacitor according to the present invention includes forming a first electrode on a portion of a substrate assembly. A high dielectric material is formed over at least a portion of the first electrode and a second electrode is formed over the high dielectric material. At least one of the first and second electrodes comprises a layer of a platinum:ruthenium alloy.

In one embodiment of the method, at least one of the first electrode and second electrode includes the layer of platinum(x):ruthenium(1−x) alloy and one or more additional conductive layers.

Another method for use in forming a storage cell including a capacitor according to the present invention is described. The method includes providing a substrate assembly including at least one active device and forming a capacitor relative to the at least one active device. The capacitor comprises at least one electrode including a barrier layer of platinum(x):ruthenium(1−x) alloy.

A semiconductor device structure according to the present invention includes a substrate assembly including a surface and a barrier layer over at least a portion of the surface. The barrier layer is formed of a platinum(x):ruthenium(1−x) alloy, wherein x is in the range of about 0.60 to about 0.995.

A capacitor structure according to the present invention includes a first electrode, a dielectric material on at least a portion of the first electrode, and a second electrode on the dielectric material. At least one of the first and second electrodes comprises a barrier layer of platinum(x):ruthenium(1−x) alloy.

A memory cell structure according to the present invention includes a substrate assembly including at least one active device and a capacitor formed relative to the at least one active device. The capacitor comprises at least one electrode including a barrier layer formed of platinum(x):ruthenium(1−x) alloy.

Another integrated circuit structure includes a substrate assembly including at least one active device and an interconnect formed relative to the at least one active device. The interconnect including a barrier layer formed of platinum(x):ruthenium(1−x) alloy.

BRIEF DESCRIPTION OF THE DRAWINGS

The present invention will be better understood from reading the following description of illustrative embodiments with reference to the attached drawings, wherein below:

FIG. 6A shows a depth profile of the deposited platinum:ruthenium alloy layer before an oxygen anneal, FIG. 6B shows a depth profile of the deposited platinum:ruthenium alloy layer after an oxygen anneal, and FIG. 6C shows an XPS montage display showing the Si signal during profile through the platinum:ruthenium layer after annealing in oxygen.

DETAILED DESCRIPTION OF THE EMBODIMENTS

Figure 1:
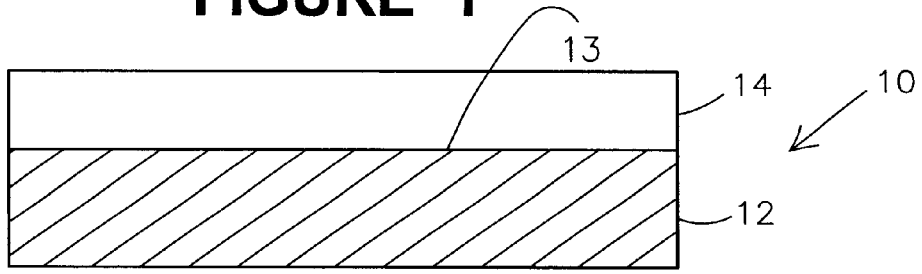
FIG. 1 shows a device structure including a platinum:ruthenium alloy layer according to the present invention.

The present invention shall be described generally with reference to FIG. 1. Thereafter, embodiments and illustrations of applications of the present invention shall be described with reference to FIGS. 2–5.

FIG. 1 illustrates a structure 10 including a substrate assembly 12 and a platinum:ruthenium alloy layer 14 according to the present invention formed on a surface 13 of the substrate assembly 12, e.g., a silicon containing surface. The structure 10 is illustrative of the use of a platinum:ruthenium alloy layer for any application requiring an effective barrier layer. In other words, the platinum:ruthenium alloy layer 14 may be used in the fabrication of semiconductor devices wherever it is necessary to prevent the diffusion of one material to an adjacent material. For example, the substrate assembly 12 may be representative of a contact structure having an opening extending to a silicon containing surface. In such a structure, diffusion barriers are commonly used in such openings to prevent undesirable reactions, such as the reaction of a contact material, e.g, aluminum, with the silicon containing surface.

Further, for example, the platinum:ruthenium alloy barrier layer 14 may be used in the formation of storage cell capacitors for use in semiconductor devices, e.g., memory devices. As further described herein, the platinum:ruthenium alloy barrier layer 14 may be used alone as an electrode in such storage cell capacitors or within a stack of layers forming an electrode of a capacitor. One skilled in the art will recognize that various semiconductor processes and structures for various devices, e.g., CMOS devices, memory devices, etc., would benefit from the barrier characteristics of the barrier layers of the present invention and in no manner is the present invention limited to the illustrative embodiments described herein.

As used in this application, "substrate assembly" refers to either a semiconductor substrate such as the base semiconductor layer, e.g., the lowest layer of a silicon material in a wafer, or a silicon layer deposited on another material, such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc.

The platinum:ruthenium alloy layer 14 according to the present invention includes an atomic composition of platinum(x):ruthenium(1−x), where preferably, x is in the range of about 0.60 to about 0.995. In other words, the amount of ruthenium necessary in the platinum layer to accomplish barrier characteristics for semiconductor devices is minimal, i.e., in the range of about 40% to about 0.5%. More preferably, x is in the range of about 0.90 to about 0.98; and, yet more preferably, x is about 0.95, i.e., about 5% ruthenium in the layer is suitable to provide barrier characteristics. In other words, preferably, the atomic composition of the platinum:ruthenium alloy layer 14 is about 95% platinum and 5% ruthenium.

The thickness of the platinum:ruthenium alloy layer 14 is dependent upon the application for which it is used. Preferably, the thickness is in the range of about 10 Å to about 10,000 Å. More preferably, the thickness of the platinum:ruthenium alloy layer 14 is in the range of about 100 Å to about 500 Å. For example, this preferred thickness range of about 100 Å to about 500 Å is applicable to a single platinum:ruthenium alloy layer forming an electrode of a capacitor.

The platinum:ruthenium alloy layer 14 formed on the surface 13 of substrate assembly 12 may be formed by one or more various processes. For example, the formation of the platinum:ruthenium alloy layer 14 may be accomplished by the simultaneous evaporation of the metals from respective sources, i.e., co-evaporation; may be sputter deposited from a single deposition target of platinum:ruthenium alloy; may be deposited by the simultaneous co-sputtering from two targets (i.e., one target including platinum and the other target including ruthenium); or may be deposited by chemical vapor deposition (CVD), for example, atmospheric pressure chemical vapor deposition, low pressure chemical vapor deposition (LPCVD), plasma enhanced chemical vapor deposition (PECVD), or any other chemical vapor deposition technique. Preferably, the formation of the platinum:ruthenium alloy layer 14 is attained by CVD.

For example, the process may be carried out in a chemical vapor deposition reactor, such as a reaction chamber available under the trade designation of 7000 from Genus, Inc., (Sunnyvale, Calif.), or available under the trade designation of 5000 from Applied Materials, Inc., (Santa Clara, Calif.), or available under the trade designation of Prism from Novelus, Inc., (San Jose, Calif.). However, any reaction chamber suitable for performing CVD may be used.

Chemical vapor deposition (CVD) is defined as the formation of a nonvolatile solid film on a substrate by the reaction of vapor phase reactants, i.e., reactant gases, that contain desired components. The reactant gases are introduced into the reaction chamber. The gases decompose and react at a heated wafer surface to form the desired layer. Chemical vapor deposition is just one process of providing thin layers on semiconductor wafers, such as films of elemental metals or compounds, e.g., platinum:ruthenium alloy layers. Chemical vapor deposition processes are favored in many respects because of the process capability to provide highly conformal layers even within deep contacts and other openings. Thus, as described further below with reference to FIGS. 4 and 5, CVD processing is preferably used to provide highly conformal layers within deep contacts and other openings such as for lower electrodes of storage cell capacitors. It will be readily apparent to one skilled in the art that although CVD is the preferred process, that the CVD process may be enhanced by various related techniques such as plasma assistance, photo assistance, laser assistance, as well as other techniques.

Preferably, according to the present invention, the co-deposition of platinum and ruthenium is conducted using a CVD process wherein a ruthenium precursor is delivered to a reaction chamber along with a platinum precursor. Preferably, the method is carried out in the presence of an oxidizing reactant gas, such as $O_2$, NO, $N_2O$, $O_3$, hydrogen peroxide, organic peroxides such as T-butyl peroxide, or any other oxidizing agent.

Typically, a liquid precursor is contained in a bubbler reservoir through which a carrier gas, such as helium or any other inert, i.e., nonreactive gas (e.g., nitrogen, argon, neon, and xenon) is bubbled through the reservoir containing the precursor to deliver the precursor to the reaction chamber. For example, a flow of carrier gas having a flow in the range of about one sccm to about 100 sccm of a nonreactive gas, i.e., nonreactive with other gases of the process, is used in a bubbler having a pressure in the range of about 0.5 to about 50 torr and a temperature in the range of about 30° C. to about 70° C. to deliver a platinum precursor to the reaction chamber. Likewise, a carrier gas, i.e., a nonreactive gas, having a flow in a range of about one sccm to about 10 sccm is used in a bubbler containing a ruthenium precursor at the conditions of about 0.5 torr to about 100 torr and a temperature of about 20° C. to about 50° C. to deliver the ruthenium precursor to the reaction chamber. Preferably, the reactant oxidizing gas is provided to the reaction chamber at a flow of about 0 sccm to about 500 sccm.

One skilled in the art will recognize that the manner in which the gases are introduced into the reaction chamber may include one of various techniques. For example, in addition to provision by bubbler techniques, the introduction may be accomplished with the use of compounds which are gases at room temperature or by a heating a volatile compound and delivering the volatile compound to the reaction chamber using a carrier gas. Further, solid precursors and various methods of vaporizing such solid precursors may also be used for introduction of reactant compounds into the chamber. As such, the present invention is not limited to any particular technique. Further, typically, the reactant gases are admitted at separate inlet ports. In addition to the reactant gases, a dilution gas (i.e., a gas that is non-reactive with the reactant gases) may also be introduced into the chamber. For example, argon gas may be introduced into the chamber at a varied flow rate.

Therefore, in accordance with the present invention, the reactant gas mixture in the reaction chamber includes at least the ruthenium precursor gas, the platinum precursor gas, and optionally the oxygen reactant gas and/or a dilution gas. Preferably, within the reaction chamber, the partial pressure of ruthenium precursor gas is kept sufficiently low such that the ruthenium deposited is within the ranges described for forming the preferred platinum:ruthenium composition of the alloy layer 14 described above. This partial pressure may be controlled by controlling the flow of the inert gas, e.g., helium, through the bubbler containing the ruthenium precursor or through control of other parameters of the process, such as temperature and pressure of the bubbler.

In the preferred CVD process, the reaction chamber pressure is preferably maintained at a deposition pressure of about 0.5 torr to about 5 torr. The deposition temperature at the wafer surface upon which the platinum:ruthenium alloy layer 14 is deposited is held at a temperature in a range of about 200° C. to about 400° C.

Any ruthenium-containing precursor and platinum-containing precursor may be used in accordance with the present invention. Preferably, the platinum containing precursors include $MeCpPtMe_3$ (where Cp=cyclopentadienyl), platinum hexafluoroacetylacetonate, $CpPtMe_3$, $Pt(acetylacetonate)_2$, $Pt(PF_3)_4$, $Pt(CO)_2Cl_2$, cis-$PtMe_2$ $[MeNC]_2$, $(COD)Pt(CH_3)_2$, $(COD)Pt(CH_3)Cl$, $(C_5H_5)Pt$ $(CH_3)(CO)$, $(acac)(Pt)(CH_3)_3$, where COD=1,5 cyclooctadiene and acac=acetylacetonate. Further, preferably, the ruthenium precursors are liquid ruthenium complexes of the following formula (Formula I): $(diene)Ru(CO)_3$ wherein: "diene" refers to linear, branched, or cyclic dienes, bicyclic dienes, tricyclic dienes, fluorinated derivatives thereof, combinations thereof, and derivatives thereof additionally containing heteroatoms such as halide, Si, S, Se, P, As, or N. These precursor complexes and others are described in Assignees' copending patent application entitled "Precursor Chemistries for Chemical Vapor Deposition of Ruthenium and Ruthenium Oxide" having Ser. No. 09/141,236, filed Aug. 27, 1998 and in Assignees' copending patent application entitled "Methods for Preparing Ruthenium and Osmium Compounds" having U.S. Ser. No. 09/141,431, filed Aug. 27, 1998. Further, for example, additional precursors are generally discussed in U.S. Pat. No. 5,372,849 to McCormick et al. More preferably, the ruthenium precursors used according to the present invention include one of $C_6H_8Ru(CO)_3$, bis(cyclopentadienyl) ruthenium (II), triruthenium dodecacarbonyl, and cyclopentadienyl dicarbonyl ruthenium (II) dimer.

Methods of forming the co-deposited platinum:ruthenium alloy layer 14 are described in co-pending patent application entitled "Method for Producing Low Carbon/Oxygen Conductive Layers" having U.S. Ser. No. 09/146,297, filed Sep. 3, 1998. One skilled in the art will recognize that these methods and various other methods may be used to form the platinum:ruthenium alloy layer 14 according to the present invention.

Figure 2:
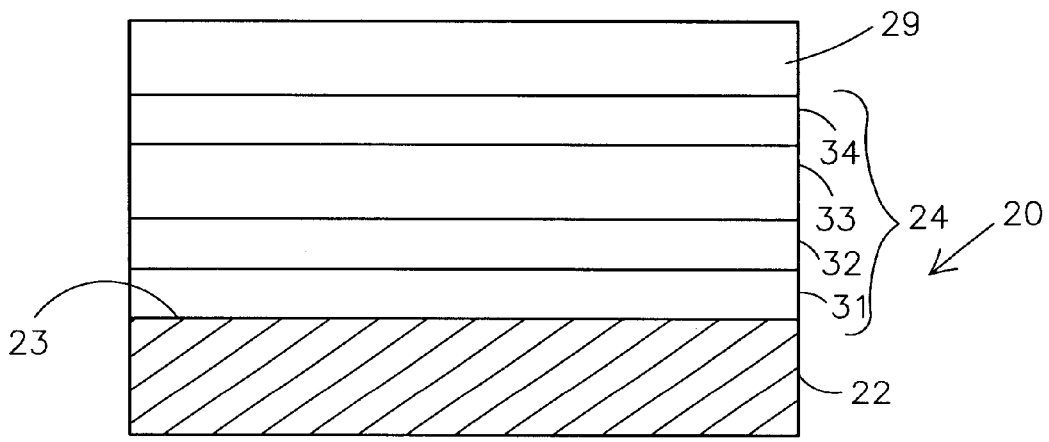
FIG. 2 shows a structure including a platinum:ruthenium alloy layer according to the present invention as part of a multiple conductive layer stack.

FIG. 2 shows a structure 20 including substrate assembly 22 and a stack 24. The stack 24 includes conductive layers 31–34. One or more of the conductive layers 31–34 are platinum:ruthenium alloy layers according to the present invention.

The one or more conductive layers, in addition to including one or more platinum:ruthenium alloy layers, may include conductive layers formed of various conductive materials. For example, the conductive layers may include, but are clearly not limited to, layers formed from metals such as platinum, paladium, rhodium, ruthenium, osmium, and iridium; metal alloys such as platinum:rhodium, platinum:ruthenium, and platinum:iridium; metal oxides such as ruthenium oxide, rhodium oxide, and iridium oxide; metal alloy oxides such as platinum:rhodium oxide, platinum:ruthenium oxide, and platinum:iridium oxide; metal nitrides such as titanium nitride, tungsten nitride, and tantalum nitride; metal silicides such as titanium silicide, ruthenium silicide, rhodium silicide, and iridium silicide.

The stack 24 may be used for one or numerous applications, e.g., interconnection applications, capacitor applications, etc. For example, stack 24 may be used as an electrode for a storage cell capacitor with substrate assembly 22 including a silicon containing surface 23. As such, the barrier properties of the stack 24 must prevent silicon diffusion from silicon-containing surface 23. In accordance with the present invention, the layer 31 may be formed as a platinum:ruthenium alloy layer to prevent diffusion of silicon from silicon-containing surface 23 through stack 24 to adjacent layer or layers 29. Further, for example, in the case where layer 29 is a high dielectric material requiring diffusion barrier properties to prevent oxygen from diffusing through stack 24, layer 34 or one of the other layers may also be formed as a platinum:ruthenium alloy barrier layer according to the present invention. One skilled in the art will recognize that the platinum:ruthenium alloy layer according to the present invention may be used in a stack of layers for a variety of applications and the stack may include one or more platinum:ruthenium alloy layers. Further, the composition of such platinum:ruthenium layers used in the same stack may differ.

Figure 3:
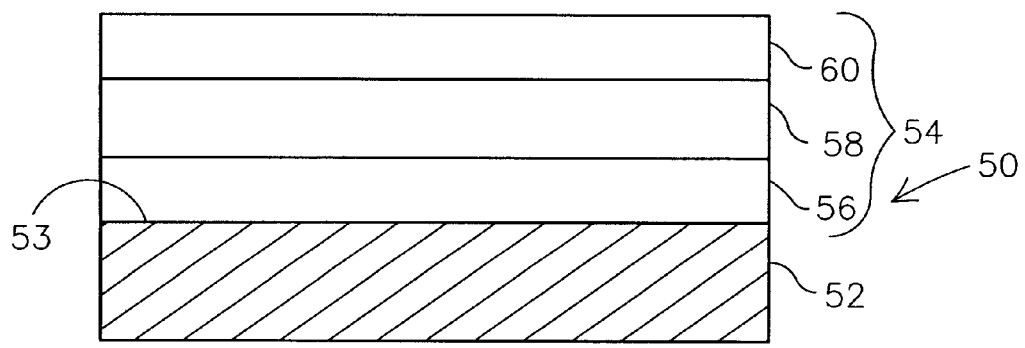
FIG. 3 is a structure including a high dielectric capacitor including an electrode having a platinum:ruthenium alloy layer according to the present invention.

FIG. 3 shows a structure 50 including substrate assembly 52 and capacitor structure 54. Capacitor structure 54 includes a first electrode 56, a second electrode 60, and a high dielectric constant layer 58 interposed therebetween. For example, the dielectric layer may be any suitable material having a desirable dielectric constant, such as $Ta_2O_5$, $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. With use of the high dielectric constant layer 58, diffusion barrier properties of the electrodes is particularly important. For example, to function well in a bottom electrode of a capacitor structure, the electrode layer or electrode stack must act as an effective barrier to the diffusion of oxygen, particularly due to the processes used to form the high dielectric constant materials. Such diffusion barrier properties are particularly required when the substrate assembly 52 includes a silicon-containing surface 53 upon which the capacitor is formed, e.g., polysilicon, silicon substrate material, N-doped silicon, P-doped silicon, etc., since oxidation of the diffused silicon may result in degraded capacitance, e.g., capacitance for a memory device. The co-deposition of the platinum with the ruthenium enhances the barrier properties of the layer formed and thus provides a significant improvement over pure platinum for electrode applications.

One skilled in the art will recognize that either of the electrodes 56, 60 may be formed as a single layer of platinum:ruthenium alloy material. Further, such electrodes 56, 60 may be formed as a stack such as described with reference to FIG. 2 including one or more layers of a platinum:ruthenium alloy material and one or more additional conductive layers.

Two illustrations of using the platinum:ruthenium alloy layer or layers as described above are shown and described below with reference to FIGS. 4 and 5. The use of the platinum:ruthenium layer or layers according to the present invention is described with reference to FIG. 4 wherein a bottom electrode of a high dielectric capacitor of a storage cell includes one or more layers of the platinum:ruthenium alloy material as described herein. Further, the use of platinum:ruthenium alloy layer or layers according to the present invention is described with reference to FIG. 5 wherein a contact liner requiring diffusion barrier characteristics is described. For simplistic purposes, the illustrative descriptions are limited to the use of the platinum:ruthenium alloy material described in these two illustrative structures. There are other semiconductor processes and structures for various devices, e.g., CMOS devices, memory devices, logic devices, etc., that would benefit from the present invention and in no manner is the present invention limited to the illustrative embodiments described herein, e.g., contact liner and electrode structure. The platinum:iridium alloy barrier layer may be used for any application requiring diffusion barrier characteristics, particularly those for preventing diffusion of oxygen and silicon into adjacent layers.

Figure 4:
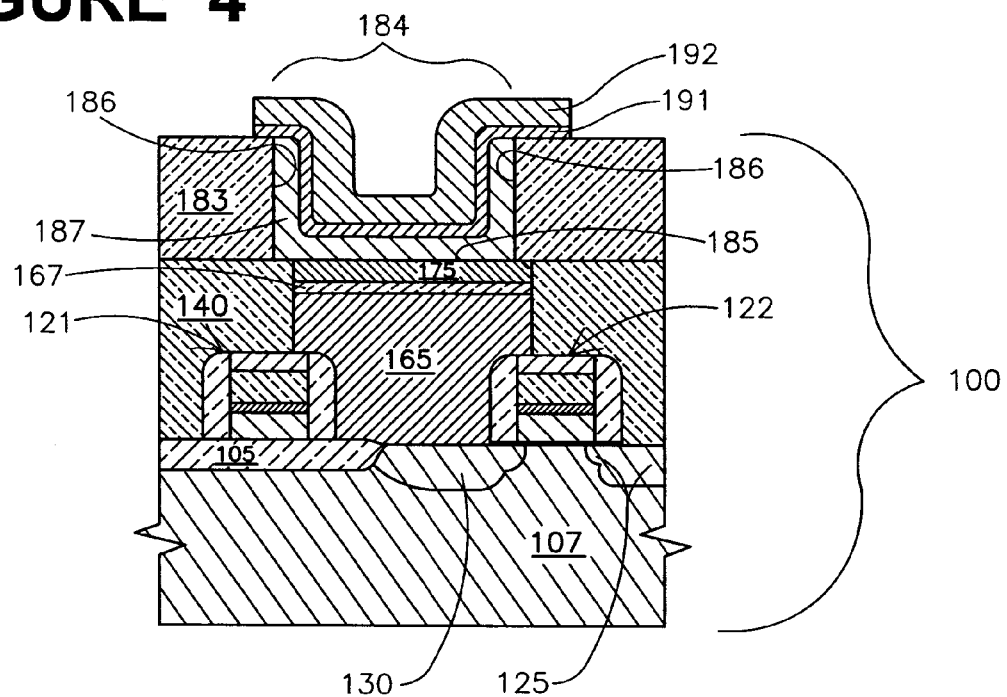
FIG. 4 illustrates the use of a platinum:ruthenium alloy layer in a storage cell capacitor application.

As shown in FIG. 4, a device structure 100 is fabricated in accordance with conventional processing techniques through the formation of an opening 184 prior to depositing a bottom electrode structure on the surfaces 185, 186 defining the opening 184. A platinum:ruthenium alloy bottom electrode is then formed in opening 184. As such, and as further described in U.S. Pat. No. 5,392,189 to Fazan, et al., the device structure 100 includes field oxide regions 105 and active regions, i.e., those regions of the substrate 107 not covered by field oxide. A word line 121 and an active device, i.e., field effect transistor (FET) 122, are formed relative to the field oxide region 105. Suitable source/drain regions 125, 130 are created in silicon substrate 107. An insulative layer of oxide material 140 is formed over regions of FET 122 and word line 121. Polysilicon plug 165 is formed to provide electrical communication between substrate 107 and the storage cell capacitor to be formed thereover. Various layers are formed over the polysilicon plug 165, including layers 167 and 175. For example, such layers may be titanium nitride, tungsten nitride, or any other metal nitride which acts as a barrier, and may also include one or more platinum:ruthenium alloy barrier layers as described herein. Thereafter, another insulative layer 183 is formed and an opening 184 is defined therein.

The opening 184 is a small high aspect ratio opening. As described herein, small high aspect ratio openings have feature sizes or critical dimensions below about 1 micron (e.g., such as a diameter or width of an opening being less than about 1 micron) and aspect ratios greater than about 1. Such aspect ratios are applicable to contact holes, vias, trenches, and any other configured openings. For example, a trench having an opening of 1 micron and depth of 3 microns has an aspect ratio of 3. The present invention is particularly beneficial for forming diffusion barrier layers in small high aspect ratio features due to the use of CVD processes for forming conformal layers of the platinum:ruthenium alloy material over step structures.

As shown in FIG. 4, a platinum:ruthenium alloy barrier layer 187 is formed on the bottom surface 185 and the one or more side walls 186 defining opening 184. A layer of platinum:ruthenium alloy material is first co-deposited over the entire structure including the bottom surface 185 and sidewalls 186 and then formed into lower electrode 187. For example, the layer may be etched or planarized to remove the desired regions for forming the bottom electrode 187. Thereafter, dielectric layer 191 is then formed relative to the platinum:ruthenium alloy diffusion barrier layer 187. Further thereafter, the second electrode 192 is formed relative to the dielectric material 191. For example, such an electrode may be of any conductive material such as the platinum:ruthenium alloy barrier material as described herein, tungsten nitride, titanium nitride, tantalum nitride, ruthenium, rhodium, iridium, ruthenium oxide, iridium oxide, any combination thereof, or any other conductive material typically used as an electrode of a storage cell capacitor. With the use of the present invention, the bottom electrode formed of platinum:ruthenium alloy material is conformally formed of uniform thickness using CVD within opening 184 providing a desired resistivity and barrier properties.

It will be recognized by one skilled in the art that any capacitor formed relative to a surface, e.g., silicon containing surface, whereupon diffusion barrier properties are required and/or conformally formed conductive layers are required will benefit from the present invention. For example, container capacitors typically includes electrodes formed on surfaces requiring conformal formation of a bottom electrode. Such a container capacitor storage cell is described in U.S. Pat. No. 5,270,241 to Dennison, et al., entitled "Optimized Container Stack Capacitor DRAM Cell Utilizing Sacrificial Oxide Deposition and Chemical Mechanical Polishing," issued Dec. 14, 1993. One skilled in the art will also recognize that the bottom electrode 187 may include a stack of layers with one or more of the layers being a platinum:ruthenium alloy barrier layer as described previously herein.

Figure 5:
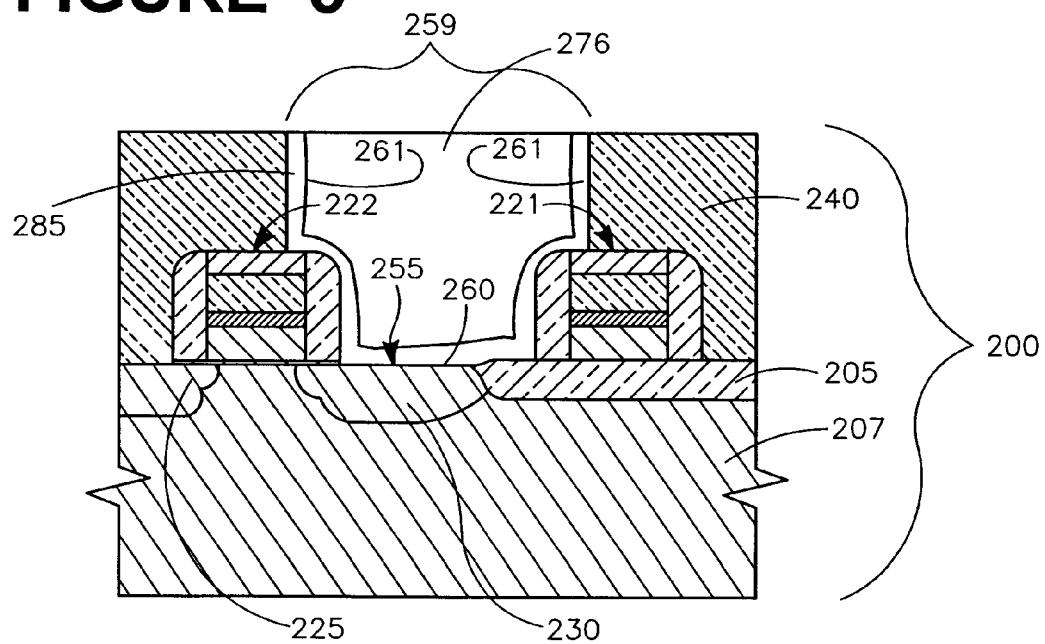
FIG. 5 illustrates the use of a platinum:ruthenium alloy layer in an interconnect application.

As shown in FIG. 5, device structure 200 is fabricated in accordance with conventional processing techniques through the formation of contact opening 259 prior to metalization of the contact area 255 of substrate 207. As such, prior to metalization, the device structure 200 includes field oxide regions 205 and active areas, i.e., those regions of substrate 207 not covered by field oxide. Formed relative to the field oxide regions 205 in the active areas are word line 221 and FET 222. Suitably doped source/drain regions 225, 230 are formed as known to one skilled in the art. A conformal layer of oxide material 240 is formed thereover and contact opening 259 is defined therein to the contact area 255 of doped region 230 of silicon substrate 207. Thereafter, one or more metalization or conductive layers are formed in the contact opening 259 for providing electrical connection to substrate region 230. For example, various materials may be formed in contact opening 259, such as titanium nitride or other diffusion barrier materials. Preferably, contact liner 285 is formed of platinum:ruthenium alloy material according to the present invention on bottom surface 260 and the one or more side walls 261 defining the opening 259. The platinum:ruthenium alloy layers are generally deposited over the entire substrate assembly and then planarized to form the contact liner 285. Thereafter, a conductive material 276 is formed in the contact opening for providing connection to doped region 230 of substrate 207.

EXAMPLE

Figure 6A:
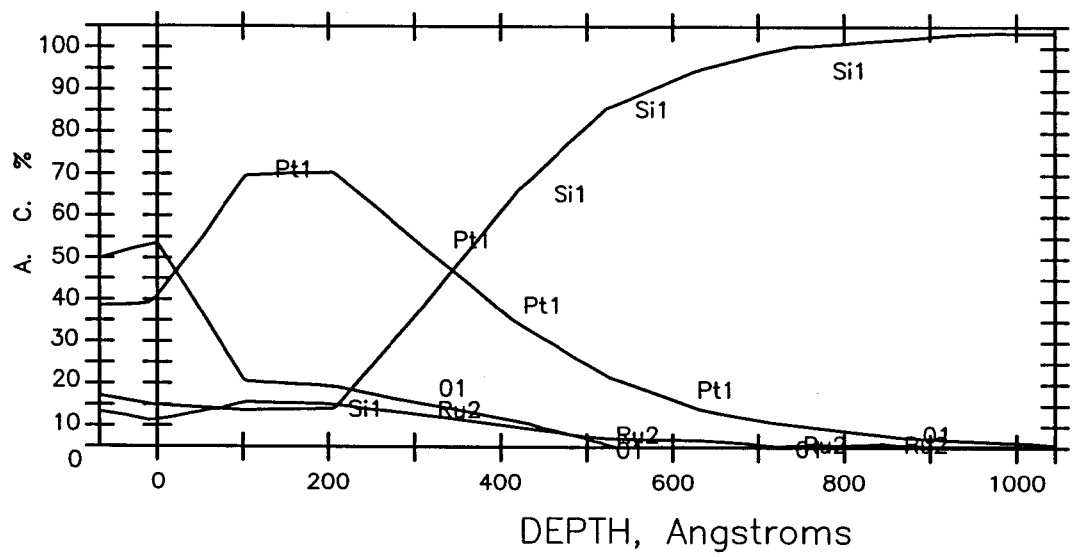
FIGS. 6A–6C show the results of an example wherein a layer of platinum:ruthenium alloy material is deposited.
Figure 6B:
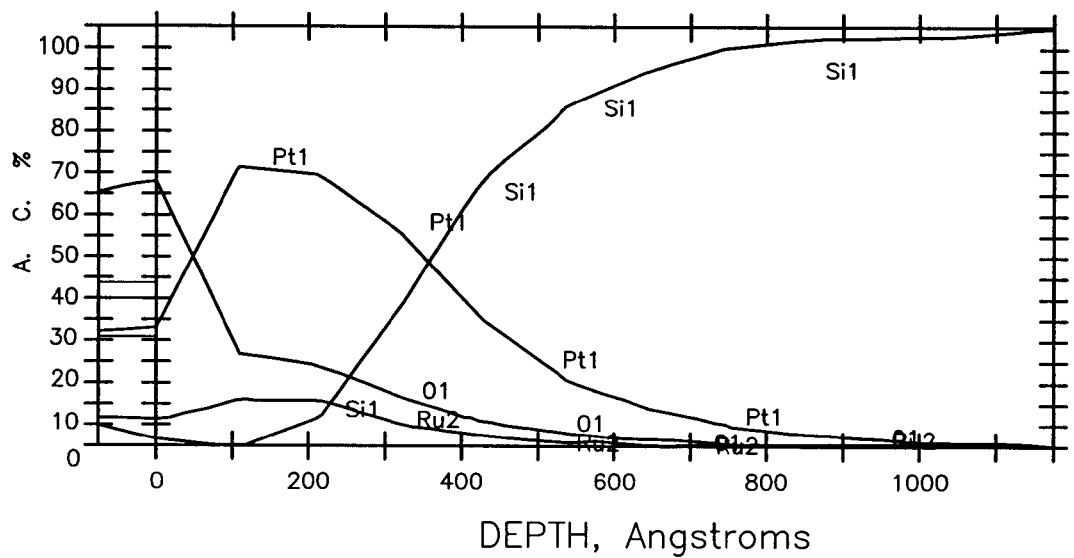

FIGS. 6A and 6B show depth profiles of a co-deposited platinum:ruthenium layer before and after an oxygen anneal, respectively. The small lab scale reaction CVD chamber was built by MDC Vaccuum Products Corp. (Hayward, Calif.) and the glass research bubbler is from Technical Glass Service (Boise, Id.). The conditions used for the co-deposition of the platinum:ruthenium layer include:

Platinum Precursor: $MeCpPt(Me)_3$.
Ruthenium Precursor: $C_6H_8Ru(CO)_3$.
Platinum Carrier Gas for use through Bubbler: 5 sccm of helium.
Ruthenium Carrier Gas for use through Bubbler: 10 sccm of helium.
Platinum Bubbler Conditions: pressure of 10 torr, temperature of 33° C.
Ruthenium Bubbler Conditions: pressure of 40 torr, temperature of 250° C.
Reaction Chamber Conditions: pressure of 5 torr, deposition temperature of 300° C. at wafer surface.
Deposition Time: 4 minutes.
Oxygen Reaction Gas: 10 sccm.

The depth profile was attained by using an XPS device available under the trade designation of PhI (Φ) 5600 from Physical Electronics (Eden Prairie, Minn.). The operating conditions for obtaining the profile include x-ray source of 350 W, monochromatic Al $k_\alpha$ (hV=1486.6 eV); 45 degree extraction; 800 μm extraction aperture. Sputtering was performed with a 4 keV Argon ion beam rastored over a 3 mm area. The sputter time for the depth profile of FIG. 6A was 13 minutes and the sputter time for the depth profile of FIG. 6B was 14.3 minutes.

Figure 6C:
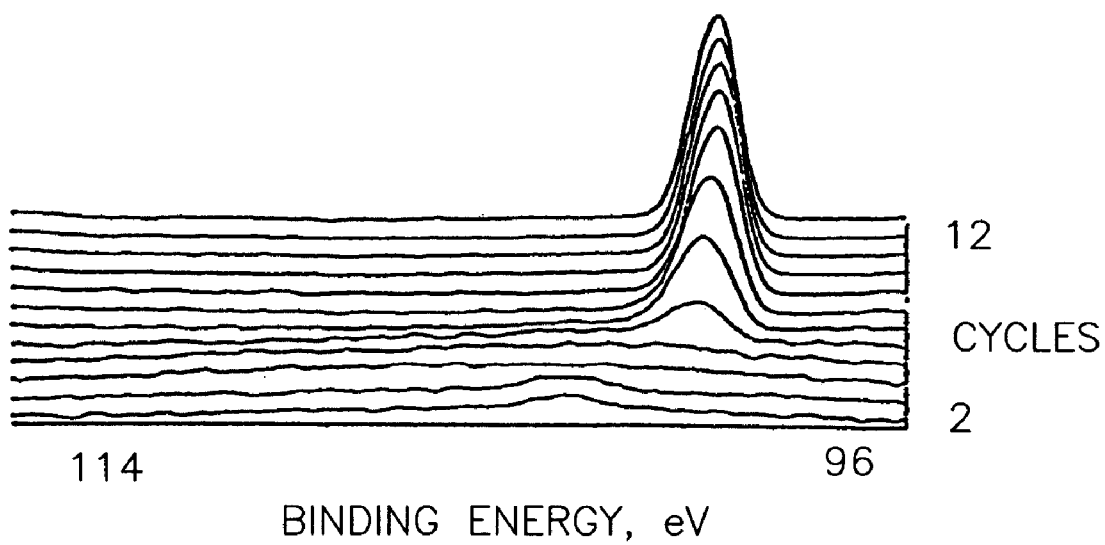

As shown in FIG. 6A, the co-deposited platinum:ruthenium layer deposited according to the above conditions is shown therein including at a depth of 200 Å a platinum composition of about 70% and a ruthenium composition of about 15%. FIG. 6B shows the co-deposited platinum:ruthenium layer after being subjected to a rapid thermal oxidation anneal at 750° C. for a period of 30 seconds. FIG. 6C shows an XPS montage display showing the Si signal during profile through the platinum:ruthenium layer, after annealing in oxygen. The peak shape shows the lack of $SiO_2$ at the interface and only traces of Si at the surface. There appears to be no silicon diffusion or oxygen diffusion through the barrier layer and therefore, no silicon dioxide formation.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may use the platinum:ruthenium alloy layer as described herein to take advantage of the beneficial barrier characteristics thereof. Various modifications of the illustrative embodiments, as well as additional embodiments to the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method for use in the fabrication of integrated circuits, the method comprising:
   providing a substrate assembly comprising a surface region including silicon; and
   forming a barrier layer over and in contact with at least a portion of the surface region, wherein the barrier layer is formed of a platinum(x):ruthenium(1−x) alloy, wherein x is in the range of about 0.90 to about 0.98.

2. The method of claim 1, wherein x is about 0.95.

3. The method of claim 1, wherein forming the barrier layer comprises forming the barrier layer by chemical vapor deposition, and further wherein forming the barrier layer by chemical vapor deposition comprises:
   providing a ruthenium-containing precursor to a reaction chamber;

providing a platinum-containing precursor to the reaction chamber;

providing an oxygen-containing component to the reaction chamber; and depositing the barrier layer using the ruthenium-containing precursor, the platinum-containing precursor, and the oxygen-containing component in the reaction chamber.

4. A method for use in the formation of a capacitor, the method comprising:

forming a first electrode on and in contact with a silicon containing portion of a substrate assembly;

forming a high dielectric material over at least a portion of the first electrode; and forming a second electrode over the high dielectric material, wherein at least the first electrode comprises a layer of a platinum(x):ruthenium(1−x) alloy, wherein at least a region of the layer of platinum(x):ruthenium (1−x) alloy is in contact with at least a region of the silicon containing portion of the substrate assembly, and further wherein x is in the range of about 0.90 to about 0.98.

5. The method of claim 4, wherein x is about 0.95.

6. The method of claim 4, wherein forming the first electrode comprising the layer of platinum(x):ruthenium(1−x) alloy comprises forming the layer of platinum(x):ruthenium(1−x) alloy by chemical vapor deposition, and further wherein forming the layer of platinum(x):ruthenium(1−x) alloy by chemical vapor deposition comprises:

providing a ruthenium-containing precursor to a reaction chamber;

providing a platinum-containing precursor to the reaction chamber;

providing an oxygen-containing component to the reaction chamber; and depositing the layer of platinum(x):ruthenium(1−x) using the ruthenium-containing precursor, the platinum-containing precursor, and the oxygen-containing component in the reaction chamber.

7. A method for use in the formation of a capacitor, the method comprising:

providing a silicon containing surface of a substrate assembly;

forming a first electrode on and in contact with at least a portion of the silicon containing surface of the substrate assembly, the first electrode including a layer of platinum(x):ruthenium(1−x) alloy;

providing a high dielectric material over at least a portion of the first electrode; and providing a second electrode over the high dielectric material, wherein the first electrode consists essentially of a single layer of platinum (x) and ruthenium (1−x) alloy.

8. The method of claim 7, wherein a thickness of the layer is in a range of about 100 Å to about 500 Å.

9. The method of claim 7, wherein forming the first electrode comprises depositing the layer of platinum (x):ruthenium (1−x) alloy by chemical vapor deposition, and further wherein depositing the layer of platinum(x):ruthenium(1−x) alloy by chemical vapor deposition comprises:

providing a ruthenium-containing precursor to a reaction chamber;

providing a platinum-containing precursor to the reaction chamber;

providing an oxygen-containing component to the reaction chamber; and depositing the layer of platinum(x):ruthenium(1−x) alloy using the ruthenium-containing precursor, the platinum-containing precursor, and the oxygen-containing component in the reaction chamber.

10. The method of claim 7, wherein x is in the range of about 0.60 to about 0.995.

11. A method for use in the formation of a capacitor, the method comprising:

providing a silicon containing surface of a substrate assembly;

forming a first electrode on and in contact with at least a portion of the silicon containing surface of the substrate assembly, the first electrode including a layer of platinum(x):ruthenium(1−x) alloy, wherein x is in the range of about 0.90 to about 0.98;

providing a high dielectric material over at least a portion of the first electrode; and providing a second electrode over the high dielectric material.

12. The method of claim 11, wherein the first electrode includes the layer of platinum(x):ruthenium(1−x) alloy and one or more additional conductive layers.

13. The method of claim 12, wherein the one or more additional conductive layers are formed from materials selected from the group of metals and metal alloys; metal and metal alloy oxides; metal nitrides; and metal silicides.

14. A method for use in forming a storage cell including a capacitor, the method comprising:

providing a substrate assembly including at least one active device, wherein the substrate assembly comprises a surface region including silicon; and forming a capacitor relative to the at least one active device, the capacitor comprising at least one electrode including a barrier layer of platinum(x):ruthenium(1−x) alloy formed on and in contact with at least a portion of the surface region, wherein forming the capacitor comprising the at least one electrode includes depositing the barrier layer of platinum (x):ruthenium(1−x) alloy by chemical vapor deposition, and further wherein depositing the barrier layer of platinum(x):ruthenium(1−x) alloy by chemical vapor deposition comprises:

providing a ruthenium-containing precursor to a reaction chamber;

providing a platinum-containing precursor to the reaction chamber;

providing an oxygen-containing component to the reaction chamber; and depositing the barrier of platinum(x):ruthenium(1−x) alloy using the ruthenium-containing precursor, the platinum-containing precursor, and the oxygen-containing component in the reaction chamber.

15. The method of claim 14, wherein x is in the range of about 0.60 to about 0.995.

16. A method for use in forming a storage cell including a capacitor, the method comprising:

providing a substrate assembly including at least one active device, wherein the substrate assembly comprises a surface region including silicon; and forming a capacitor relative to the at least one active device, the capacitor comprising at least one electrode including a barrier layer of platinum(x):ruthenium(1−x) alloy formed on and in contact with at least a portion of the surface region, wherein x is in the range of about 0.90 to about 0.98.

17. A method for use in the fabrication of integrated circuits, the method comprising:

provi ding a substrate assembly comprising a surface region including silicon; and co-depositing platinum and ruthenium as a barrier layer over the at least a portion of the surface region by chemical vapor deposition, wherein the barrier layer is formed of a platinum(x):ruthenium(1−x) alloy, where x is in the range of about 0.60 to about 0.995, and further wherein co-depositing the platinum and ruthenium alloy by chemical vapor deposition comprises:

providing a ruthenium-containing precursor to a reaction chamber;

providing a platinum-containing precursor to the reaction chamber; and co-depositing the barrier layer of platinum(x):ruthenium(1−x) alloy using the ruthenium-containing precursor and the platinum-containing precursor in the reaction chamber.

18. The method of claim 17, wherein x is in the range of about 0.90 to about 0.98.

19. A method for use in the formation of a capacitor, the method comprising:

forming a first electrode on a portion of a substrate assembly;

forming a high dielectric material over at least a portion of the first electrode; and forming a second electrode over the high dielectric material, wherein at least one of the first and second electrodes comprises a layer of a platinum:ruthenium alloy, wherein the layer of platinum:ruthenium alloy is formed through co-deposition of platinum and ruthenium by chemical vapor depositions and further wherein co-depositing the platinum and ruthenium by chemical vapor deposition comprises:

providing a ruthenium-containing precursor to a reaction chamber;

providing a platinum-containing precursor to the reaction chamber; and co-depositing the layer of platinum:ruthenium alloy using the ruthenium-containing precursor and the platinum-containing precursor in the reaction chamber.

20. The method of claim 19, wherein the layer of platinum:ruthenium alloy is a layer of a platinum(x):ruthenium (1−x) alloy, where x is in the range of about 0.60 to about 0.995.

21. The method of claim 20, wherein x is in the range of about 0.90 to about 0.98.

22. A method for use in the formation of a capacitor, the method comprising:

providing a silicon containing surface of a substrate assembly;

forming a first electrode on at least a portion of the silicon containing surface of the substrate assembly, the first electrode including a layer of platinum(x):ruthenium (1−x) alloy formed through co-deposition of platinum and ruthenium by chemical vapor deposition, and further wherein co-depositing the platinum and ruthenium by chemical vapor deposition comprises:

providing a ruthenium-containing precursor to a reaction chamber, providing a platinum-containing precursor to the reaction chamber, and co-depositing the layer of platinum(x):ruthenium(1−x) alloy using the ruthenium-containing precursor and the platinum-containing precursor in the reaction chamber;

providing a high dielectric material over at least a portion of the first electrode; and providing a second electrode over the high dielectric material.

23. The method of claim 22, wherein the first electrode consists essentially of a single layer of platinum (x) and ruthenium (1−x) alloy.

24. The method of claim 23, wherein a thickness of the layer is in a range of about 100 Å to about 500 Å.

25. The method of claim 22, wherein x is in the range of about 0.60 to about 0.995.

26. The method of claim 25, wherein x is in the range of about 0.90 to about 0.98.

27. The method of claim 22, wherein the first electrode includes the layer of platinum(x):ruthenium(1−x) alloy and one or more additional conductive layers.

28. The method of claim 27, wherein the one or more additional conductive layers are formed from materials selected from the group of metals and metal alloys; metal and metal alloy oxides; metal nitrides; and metal silicides.

29. A method for use in forming a storage cell including a capacitor, the method comprising:

providing a substrate assembly including at least one active device, wherein the substrate assembly comprises a surface region including silicon; and forming a capacitor relative to the at least one active device, the capacitor comprising at least one electrode including a barrier layer of platinum(x):ruthenium(1−x) alloy, wherein the barrier layer of platinum:ruthenium alloy is formed through co-depositing platinum and ruthenium by chemical vapor deposition, and further wherein co-depositing the platinum and ruthenium by chemical vapor deposition comprises:

providing a ruthenium-containing precursor to a reaction chamber, providing a platinum-containing precursor to the reaction chamber, and co-depositing the barrier layer of platinum(x):ruthenium(1−x) alloy using the ruthenium-containing precursor and the platinum-containing precursor in the reaction chamber.

30. The method of claim 29, wherein x is in the range of about 0.60 to about 0.995.

31. The method of claim 30, wherein x is in the range of about 0.90 to about 0.98.

32. The method of claim 17, wherein co-depositing the barrier layer further comprises providing an oxygen-containing component to the reaction chamber and co-depositing the layer of platinum(x):ruthenium(1−x) alloy using the ruthenium-containing precursor, the platinum-containing precursor, and the oxygen-containing component in the reaction chamber.

33. The method of claim 22, wherein co-depositing the barrier layer further comprises providing an oxygen-containing component to the reaction chamber and co-depositing the layer of platinum(x):ruthenium(1−x) alloy using the ruthenium-containing precursor, the platinum-containing precursor, and the oxygen-containing component in the reaction chamber.

34. The method of claim 29, wherein co-depositing the barrier layer further comprises providing an oxygen-containing component to the reaction chamber and co-depositing the layer of platinum(x):ruthenium(1−x) alloy using the ruthenium-containing precursor, the platinum-containing precursor, and the oxygen-containing component in the reaction chamber.

* * * * *

UNITED STATES PATENT AND TRADEMARK OFFICE
CERTIFICATE OF CORRECTION

PATENT NO.     : 6,323,081 B1
DATED          : November 27, 2001
INVENTOR(S)    : Eugene P. Marsh It is certified that error appears in the above-identified patent and that said Letters Patent is hereby corrected as shown below:

Title page,
Item [56], References Cited, U.S. PATENT DOCUMENTS, in the 5,679,225 patent reference, please delete "Pastacataldi et al." and insert -- Pastacaldi et al. -- therefor.

Item [56], References Cited, U.S. PATENT DOCUMENTS, in the 6,204,172 patent reference, please insert -- B1 -- after "6,204,172".

Item [56], References Cited, OTHER PUBLICATIONS, in the Hsu et al. reference, please delete "IrOS$_3$" and insert -- IrOs$_3$ -- therefor.

Item [56], References Cited, OTHER PUBLICATIONS, in the Macomber et al. reference, please delete "($\eta^5$-C$_5$H$_4$CH$_2$)" and insert -- ($\eta^5$-C$_5$H$_4$CH=CH$_2$) -- therefor.

Item [56], References Cited, OTHER PUBLICATIONS, in the Macomber et al. reference, please delete "*Organometallics*" and insert -- *Organometallic* -- therefor.

Column 1,
Line 65, please delete "*AppL*" and insert -- *Appl.* --therefor.

Column 2,
Line 6, please delete paragraph break which occurs after "openings."

Column 8,
Line 18, please delete "iridium" and insert -- ruthenium -- therefor.

Column 10,
Line 8, please delete "250ºC" and insert -- 25ºC. -- therefor.

UNITED STATES PATENT AND TRADEMARK OFFICE
CERTIFICATE OF CORRECTION

PATENT NO. : 6,323,081 B1
DATED : November 27, 2001
INVENTOR(S) : Eugene P. Marsh It is certified that error appears in the above-identified patent and that said Letters Patent is hereby corrected as shown below:

Column 13,
Line 32, please delete "depositions" and insert -- deposition, -- therefor.

Signed and Sealed this

Third Day of September, 2002

Attest:

Attesting Officer

JAMES E. ROGAN
Director of the United States Patent and Trademark Office